United States Patent
Lee et al.

(10) Patent No.: US 8,889,553 B2
(45) Date of Patent: Nov. 18, 2014

(54) METHOD FOR POLISHING THROUGH-SILICON VIA (TSV) WAFERS AND A POLISHING COMPOSITION USED IN THE METHOD

(75) Inventors: Kang-Hua Lee, Gangshan Township, Kaohsiung County (TW); Wen-Cheng Liu, Linyuan Township, Kaohsiung County (TW)

(73) Assignee: Cabot Microelectronics Corporation, Aurora, IL (US)

( * ) Notice: Subject to any disclaimer, the term of this patent is extended or adjusted under 35 U.S.C. 154(b) by 126 days.

(21) Appl. No.: 12/807,898

(22) Filed: Sep. 16, 2010

(65) Prior Publication Data

US 2011/0070736 A1  Mar. 24, 2011

(30) Foreign Application Priority Data

Sep. 18, 2009 (TW) .............................. 98131531 A

(51) Int. Cl.
*H01L 21/461* (2006.01)
*H01L 21/302* (2006.01)

(52) U.S. Cl.
USPC ............ 438/690; 438/691; 438/692; 438/693

(58) Field of Classification Search
CPC ................. H01L 21/30625; H01L 21/3212; H01L 21/32137; C09G 1/02; C09K 3/1409; C09K 3/1454

See application file for complete search history.

(56) References Cited

U.S. PATENT DOCUMENTS

| | | | |
|---|---|---|---|
| 6,194,317 B1 * | 2/2001 | Kaisaki et al. | 438/692 |
| 6,524,167 B1 * | 2/2003 | Tsai et al. | 451/41 |
| 2003/0178320 A1 * | 9/2003 | Liu et al. | 205/640 |
| 2011/0070736 A1 * | 3/2011 | Lee et al. | 438/693 |

* cited by examiner

*Primary Examiner* — Duy Deo
(74) *Attorney, Agent, or Firm* — Thomas E. Omholt; Arlene Hornilla

(57) ABSTRACT

A method for polishing Through-Silicon Via (TSV) wafers is provided. The method comprises a step of subjecting the surface of a TSV wafer to a polishing treatment with a polishing composition containing an organic alkaline compound, an oxidizing agent selected from sodium chlorite and/or potassium bromate, silicon oxide abrasive particles, and a solvent to simultaneously remove Si and conductive materials at their respective removal rates. By using the method of this invention, Si and conductive materials can be simultaneously polished at higher removal rates to significantly save the necessary working-hour costs for polishing TSV wafers. A polishing composition used in the above method is also provided.

14 Claims, 1 Drawing Sheet

METHOD FOR POLISHING THROUGH-SILICON VIA (TSV) WAFERS AND A POLISHING COMPOSITION USED IN THE METHOD

FIELD OF THE INVENTION

The present invention relates to a polishing method, especially, a method for polishing a through-silicon via (TSV) wafer. The present invention also relates to a polishing composition used for conducting the method.

BACKGROUND OF THE INVENTION

FIG. 1 shows the original structure of a TSV wafer 1, which comprises an integrated circuit layer 11, a silicon wafer layer 12 arranged on integrated circuit layer 11, and conductive materials 13. Conductive materials 13 are buried in silicon wafer layer 12, are approximately perpendicular to surface 121 of silicon wafer layer 12, and connect to integrated circuit layer 11. Generally, end surfaces 131 of conductive materials 13 in an unpolished TSV wafer are about a couple hundred micrometers from surface 121 of silicon wafer layer 12.

Surface 121 is subsequently polished by grinding, so that silicon wafer layer 12 is rapidly thinned, and thereby the distance between end surfaces 131 of conductive materials 13 and surface 121 of silicon wafer layer 12 is reduced to about tens of micrometers or more.

After grinding and thinning silicon wafer layer 12, a damaged layer 14 is formed near surface 121 as shown in FIG. 2. Therefore, after the grinding step, surface 121 should be subjected to fine polishing with a chemical mechanical polishing (CMP) to finish and remove damaged layer 14, and further polish TSV wafer 1 to the desired status.

The ideal status of the finely polished TSV wafer 1 is varied upon the requirements for the subsequent processes. For example, end surfaces 131 of the conductive materials 13 and top surface 121 of silicon wafer layer 12 surrounding thereof are coplanar as shown in FIG. 3, or end surfaces 131 are protruding out of top surface 121 as shown in FIG. 4.

In practical operation, when a TVS wafer is subjected to a CMP process, the silicon wafer layer 12 and the conductive materials 13 are generally polished simultaneously. Thus, for manufacturers who need to polish a substantial amount of TSV wafers, if both the silicon wafer layer 12 and the conductive materials 13 can be simultaneously and rapidly removed to a suitable status, it may save a very considerable working-hour cost in the manufacturing process. However, the commercially available polishing compositions are mainly designed for common silicon wafers composed of only one single material, either silicon or a conductive material, and are not suitable for directly polishing a TSV wafer.

U.S. Pat. No. 4,169,337 is directed to a polishing composition for a silicon wafer comprising colloidal silicon oxide ($SiO_2$) abrasive particles or silica gel, and water-soluble amine. U.S. Pat. No. 5,230,833 is directed to another polishing composition for a silicon wafer comprising colloidal silicon oxide abrasive particles, an organic base and a bactericide. Currently, it is the view of industry that a polishing composition comprising silicon oxide abrasive particles and an organic amine has a significant polishing effect on silicon.

U.S. Pat. No. 5,225,034 is directed to a polishing composition for a conductive material comprising silver nitrate ($AgNO_3$), a solid abrasive material, and an oxidizing agent selected from the following agents: hydrogen peroxide ($H_2O_2$), hypochlorous acid (HOCl), potassium hypochlorite (KOCl) or acetic acid ($CH_3COOH$). In general, the polishing compositions for the conductive material commonly used in the industry usually comprise an acidic compound and an oxidizing agent to exhibit a significant polishing effect on the conductive material.

The polishing compositions mentioned above are suitable for polishing a specific single substance such as silicon or a conductive material. When simultaneously polishing silicon and conductive materials, the removal rates for the two substances are very different from each other, and therefore, it is difficult to increase the polishing rates for silicon and the conductive material simultaneously by increasing the amount of one specific ingredient in the polishing composition. For example, when increasing ethylenediamine concentration in the polishing composition, the silicon removal rate significantly exceeds the conductive material removal rate. That is, the silicon removal rate may be higher than 10,000 Å/min while the conductive material removal rate may only be about 1,000 Å/min.

Similarly, the oxidizing agent hydrogen peroxide widely used in the polishing composition may be useful for polishing the conductive materials; however, it may easily oxidize silicon to hard silica. Therefore, when increasing the amount of hydrogen peroxide in the polishing composition, the conductive material removal rate is also increased but the silicon removal rate decreases significantly.

Accordingly, hydrogen peroxide is not considered to be suitable as an ingredient of the polishing composition for simultaneously polishing silicon and a conductive material. There is need for a polishing composition for use in the semiconductor industry that is suitable for polishing a TSV wafer comprising both silicon and a conductive material and can also rapidly and simultaneously remove the silicon and the conductive material on the TSV wafer to be polished (particularly at rates of at least 6000 Å/min for both silicon and conductive material). In addition, the components of the polishing composition should be easily available. A relative polishing method should also be provided.

BRIEF SUMMARY OF THE INVENTION

The inventors of the present application attempted to use sodium chlorite or potassium bromate as the oxidizing agent and sodium chlorite and/or potassium bromate in combination with an organic alkaline compound as the components of a polishing composition. Surprisingly, the formulated polishing composition shows excellent polishing effects on both silicon and conductive materials. It is confirmed through experiments that the removal rates for both substances simultaneously can even exceed 9,500 Å/min under machine operating conditions in which the polishing pressure is less than 3 psi, and the rotation rates of the polishing pad and the polishing head are less than 100 rpm.

A first objective of the present invention is to provide a polishing method which can simultaneously and rapidly remove conductive materials and silicon on a TSV wafer to be polished. The polishing method comprises subjecting the surface of a TSV wafer to a polishing treatment with a polishing composition to simultaneously remove Si and conductive material on the TSV wafer at their respective removal rates, wherein the polishing composition comprises an organic alkaline compound, an oxidizing agent selected from a chlorite salt and/or bromated salt, silicon oxide abrasive particles and a solvent.

The second objective of the present invention is to provide a polishing composition used in the method of the present invention as mentioned above.

By the method of the present invention and the polishing composition used therein, the silicon and conductive materials on a TSV wafer are simultaneously removed in a more acceptable rate without using hydrogen peroxide. A novel and reliable polishing method and polishing composition for the CMP process of the TSV wafer are also provided.

BRIEF DESCRIPTION OF THE DRAWING(S)

DETAILED DESCRIPTION OF THE INVENTION

The method for polishing a TSV wafer according to the present invention is to subject one surface of the TSV wafer to a polishing treatment with the aforesaid polishing composition of the present invention. During the polishing treatment, the polishing composition flows towards the polishing pad and the TSV wafer at a certain flow rate at the same time that the TSV wafer comes into contact with the polishing pad with a polishing pressure. The TSV wafer and the polishing pad respectively have their rotation rates to polish the TSV wafer.

Figure 1:
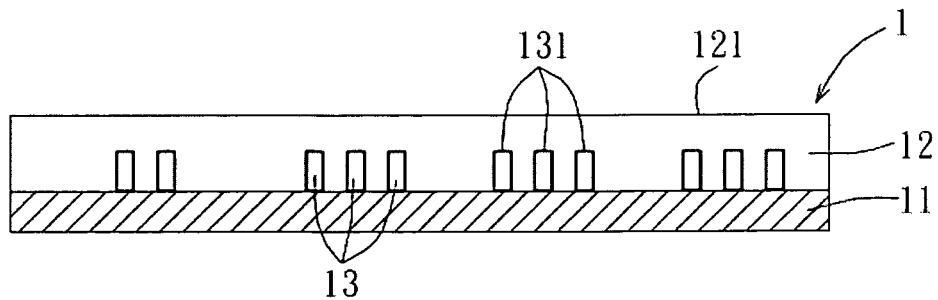
FIG. 1 is an illustration showing the original structure of an unpolished TSV wafer.
Figure 2:
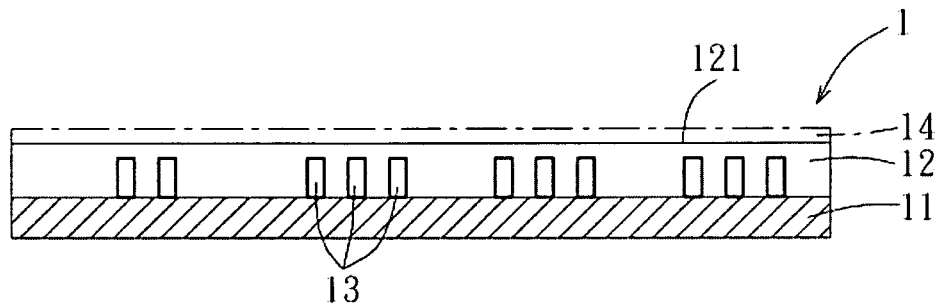
FIG. 2 is an illustration showing the corresponding statuses of each component in a TSV wafer before and after grinding.
Figure 3:
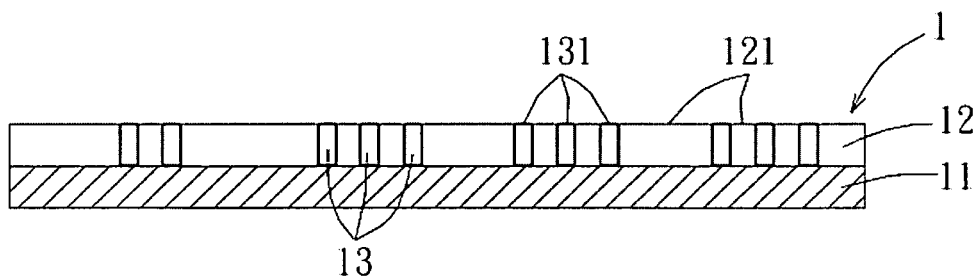
FIGS. 3 and 4 are illustrations that present the end surfaces of conductive materials after CMP polishing, which are coplanar with or protruding out of the surface of the silicon wafer layer.
Figure 4:
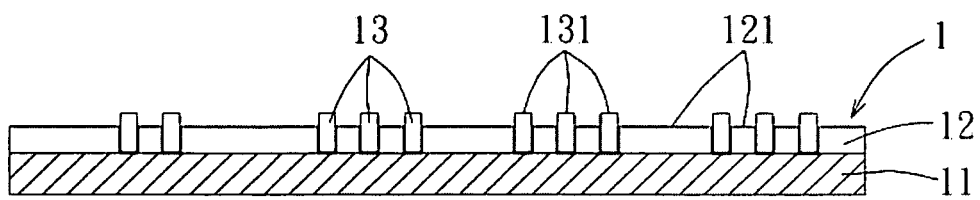

It should be first clarified that the "surface of the TSV wafer" means the surface of the TSV wafer that is farthest away from integrated circuit layer 11 and may be surface 121 of the silicon wafer layer (as shown in FIG. 1) or cover end surfaces 131 of conductive materials 13 (as shown in FIG. 3).

With such an operation, the removal rates of the conductive material and silicon on a TSV wafer can both exceed 6,000 Å/min, even 8,000 Å/min and 9,500 Å/min. The conductive material is preferably selected from copper, tungsten, aluminum and polysilicon. In the following examples, the exemplified conductive material is made of copper.

It should be noted that the method of the present invention may be adjusted depending on the component designs in various polishing machines or the operation manners of the users. The components can either first be mixed to form the polishing composition of the present invention and then flow from the polishing machine, or each component can be simultaneously and separately introduced via different pipes of the polishing machine and flow onto the machine at the same time that it is being mixed to form the polishing composition of the present invention. Furthermore, for the stability and transportation of the composition or restoration convenience for users, the polishing composition of the present invention may be formulated into a concentrated solution individually or in combination. In the following examples, the polishing compositions are exemplified by the operation manner that "the components are mixed to provide a polishing composition with the preferred concentration and the composition subsequently flows from the polishing machine."

In the present invention, the pH value and the species and concentration of each ingredients of the polishing composition of the present invention are not particularly limited. However, considering both the costs and polishing effects of the polishing composition of the present invention that are associated with the practices in the industry, the species and amounts of each ingredient will be further explained and suggested in the following descriptions.

The organic alkaline compound is preferably selected from diamines, triamines, tetramines and combinations thereof. The useful diamines comprise, for example, ethylenediamine, N-(-2-hydroxyethyl)ethylenediamine, 1,2-diaminopropane, or combinations thereof. In the following examples, the exemplified diamines are ethylenediamine, N-(-2-hydroxyethyl)ethylenediamine and 1,2-diaminopropane.

The useful triamines comprise, for example, diethylenetriamine. The useful tetramines comprise, for example, triethylenetetramine. Both of them are exemplified in the following examples.

In the method of the present invention, the oxidizing agent contained in the used polishing composition is preferably a chlorite salt or a bromate salt, or a combination thereof. Furthermore, the solvent may be water as exemplified in the following examples.

The silicon oxide abrasive particle can be selected from colloidal silica, fumed silica, precipitated silica and combinations thereof. In the following examples, the exemplified silicon oxide abrasive particle is colloidal silica.

In addition to the above basic ingredients: organic alkaline compound, oxidizing agent, silicon oxide abrasive particles and solvent, the polishing composition used in the method according the present invention may further comprise an amino acid, which is used as an additive to facilitate the removal of the conductive material. The suggested amino acid comprises alanine, β-alanine, aspartic acid, arginine, glutamic acid, ethylenediaminetetraacetic acid (EDTA), diethylenetriaminepentaacetic acid (DTPA), propylenediaminetetraacetic acid (PDTA), glycine or combinations thereof. In the following examples, the exemplified amino acid is glycine.

Furthermore, the organic alkaline compound is preferably present in the polishing composition of the present invention from about 0.01 wt % to about 10 wt %, more preferably from 0.1 wt % to about 5 wt %. In the following examples, the exemplified concentration of the organic alkaline compound ranges from about 0.5 wt % to about 2 wt %.

The oxidizing agent is present in the polishing composition of the present invention preferably from about 0.01 wt % to about 10 wt %, and more preferably from 0.1 wt % to about 5 wt %. In the following examples, the exemplified concentration of the oxidizing agent ranges from about 0.4 wt % to about 3 wt %.

The silicon oxide abrasive particles are present in the polishing composition of the present invention preferably from about 0.01 wt % to about 30 wt % and more preferably from 0.1 wt % to about 15 wt %. In the following examples, the exemplified concentration of the silicon oxide abrasive particles ranges from about 1.25 wt % to about 10 wt %.

When the polishing composition of the present invention further comprises an amino acid, the amino acid is present in the polishing composition preferably from about 0.01 wt % to about 5 wt %, and more preferably from about 0.1 wt % to about 2 wt %. In the following examples, the exemplified amino acid is present in the polishing composition of the present invention from about 0.3 wt % to about 0.5 wt %.

The pH range of the polishing composition according to the present invention is preferably higher than 9, and more preferably higher than 10.

The embodiments and effects of the present invention will be explained in the examples and comparative examples, and the species and the amounts of the components of the polishing composition thereof are shown in Table 1 (based on wt %). These examples and comparative examples employ the following chemicals and equipments. It should be noted that these Examples are intended for exemplification, and should not be regarded as limitation to the scope of the present invention.

Unless it is specifically explained, the polishing method in the examples and comparative examples were conducted at the atmospheric temperature and atmospheric pressure. Each polishing composition was prepared by using water as a solvent, and was subjected to polish a bare silicon wafer and a blanket copper wafer in a pre-determined duration, respectively. The silicon and copper polishing rates were obtained by measuring the thicknesses of the wafers before and after polishing and calculating the resultant values. The polishing method of the examples and the comparative examples were conducted using the same machine parameters (i.e., polishing pressure=3 psi, rotation rate of the polishing head (rotation rate of TSV wafer)=87 rpm, rotation rate of the polishing pad=93 rpm, flow rate of the polishing composition=200 ml/min, polishing duration=1 min).

Components and apparatuses included (1) polishing machine: POLI-500 commercially available from G&P Inc. (Korea); (2) polishing pads: EPIC D100 polishing pads commercially available from Cabot Microelectronics Corporation (USA); (3) bare silicon wafers: a common bare silicon wafer commercially available from Silicon Valley Microelectronics, Inc. (USA); (4) blanket copper wafers: a blanket copper wafer with 1.5 μm copper film commercially available from SKW Associates, Inc. (USA); (5) silicon oxide abrasive particles: BINDZIL SP599L commercially available from Akzo Nobel Inc. (Amsterdam, Netherlands); (6) the following chemical reagents with a purity of 99% or more, commercially available from several suppliers, including, for example, ACROS (Geel, Belgium), MERCK KGaA (Darmstadt, Germany), and Showa Chemical (Tokyo, Japan): ethylenediamine, diethylenetriamine, triethylenetetramine, N-(-2-hydroxyethyl)ethylenediamine, 1,2-diaminopropane, potassium hydroxide, sodium chlorite, potassium bromate, hydrogen peroxide and glycine.

TABLE 1

| | | SiO$_2$ abrasive particles | Alkaline compound species | amount | Oxidizing agent sodium chlorite | potassium bromate | hydrogen peroxide | total amount | Glycine | Removal rate (Å/min) silicon | copper |
|---|---|---|---|---|---|---|---|---|---|---|---|
| Comparative Example | 1 | 1.25 | potassium hydroxide | 1.0 | — | — | 0.06 | 0.06 | — | 2009 | 0 |
| | 2 | 1.25 | potassium hydroxide | 1.0 | — | — | 0.10 | 0.10 | — | 506 | 0 |
| | 3 | 1.25 | potassium hydroxide | 1.0 | 0.55 | — | — | 0.55 | — | 5727 | 0 |
| | 4 | 1.25 | ethylenediamine | 1.5 | — | — | — | — | — | 9450 | 350 |
| | 5 | 1.25 | ethylenediamine | 1.5 | — | — | 0.10 | 0.10 | — | 8748 | 4998 |
| | 6 | 1.25 | ethylenediamine | 1.5 | — | — | 0.15 | 0.15 | — | 2747 | 7551 |
| | 7 | 1.25 | ethylenediamine | 1.5 | — | — | 0.30 | 0.30 | — | 2046 | 7855 |
| | 8 | 1.25 | ethylenediamine | 1.5 | — | — | 0.50 | 0.50 | — | 1736 | 9640 |
| | 9 | 1.25 | — | — | 0.55 | — | — | 0.55 | — | 3062 | 0 |
| Example | 1 | 1.25 | ethylenediamine | 1.5 | 0.50 | — | — | 0.50 | — | 10374 | 6070 |
| | 2 | 1.25 | ethylenediamine | 1.5 | 0.55 | — | — | 0.55 | — | 9636 | 7174 |
| | 3 | 1.25 | ethylenediamine | 1.5 | 0.60 | — | — | 0.60 | — | 9404 | 8126 |
| | 4 | 5.00 | ethylenediamine | 2.0 | 0.55 | — | — | 0.55 | — | 8953 | 9283 |
| | 5 | 10.00 | ethylenediamine | 2.0 | 0.55 | — | — | 0.55 | — | 9595 | 9997 |
| | 6 | 1.25 | ethylenediamine | 2.0 | 2.00 | — | — | 2.00 | — | 6615 | 12853 |
| | 7 | 1.25 | ethylenediamine | 0.5 | — | 1.00 | — | 1.00 | 0.50 | 8242 | 7498 |
| | 8 | 1.25 | ethylenediamine | 1.5 | — | 1.00 | — | 1.00 | 0.50 | 9800 | 9283 |
| | 9 | 1.25 | ethylenediamine | 0.5 | — | 3.00 | — | 3.00 | 0.50 | 7340 | 8926 |
| | 10 | 1.25 | ethylenediamine | 1.5 | — | 3.00 | — | 3.00 | 0.50 | 9732 | 10711 |
| | 11 | 1.25 | ethylenediamine1 | 1.0 | — | 2.00 | — | 2.00 | 0.30 | 9417 | 6427 |
| | 12 | 1.25 | diethylenetriamine | 1.0 | 0.40 | — | — | 0.40 | 0.40 | 6260 | 9768 |
| | 13 | 1.25 | | 1.5 | 0.40 | — | — | 0.40 | — | 6834 | 6183 |
| | 14 | 1.25 | | 1.0 | 0.80 | — | — | 0.80 | — | 7436 | 7900 |
| | 15 | 1.25 | | 1.5 | 0.80 | | | 0.80 | 0.40 | 8351 | 11519 |
| | 16 | 1.25 | ethylenediamine | 1.0 | 0.40 | | | 0.40 | 0.40 | 8447 | 8485 |
| | 17 | 1.25 | | 1.5 | 0.40 | | | 0.40 | — | 8925 | 6800 |
| | 18 | 1.25 | | 1.0 | 0.80 | | | 0.80 | — | 7135 | 6840 |
| | 19 | 1.25 | | 1.5 | 0.80 | | | 0.80 | 0.40 | 7381 | 10824 |
| | 20 | 1.25 | Triethylenetetramine | 1.0 | 0.40 | | | 0.40 | 0.40 | 7299 | 7259 |
| | 21 | 1.25 | N-(-2-hydroxyethyl)ethylenediamine | 1.5 | 0.80 | | | 0.80 | 0.40 | 6752 | 8252 |
| | 22 | 1.25 | 1,2-diaminopropane | 1.5 | 0.80 | | | 0.80 | 0.40 | 7873 | 9204 |

In reference to comparative Examples 1 to 4 in Table 1, the first three polishing compositions are prepared from silicon oxide abrasive particles, potassium hydroxide and other oxidizing agents, and they show no polishing effect on copper. Nonetheless, the polishing composition of comparative Example 4 comprises ethylenediamine only, in addition to silicon oxide abrasive particles and a solvent, and shows a silicon removal rate of up to 9,450 Å/min but a copper removal rate of 350 Å/min only, which is too low.

In reference to comparative Examples 1 and 2 and comparative Examples 5 to 8, these compositions use hydrogen peroxide as the oxidizing agent; nevertheless, the silicon removal rates attained thereby are significantly decreased as the hydrogen peroxide amount is increased. It can be found that hydrogen peroxide is indeed not suitable as an ingredient of a polishing composition.

In comparative Examples 5 to 8, each of the polishing compositions comprises ethylenediamine in the same amount and hydrogen peroxide in a gradually increased amount. Although such alterations reduce the silicon removal rate from 9,869 Å/min to 1,736 Å/min, and the copper removal rate is increased from 3,570 Å/min to 9,640 Å/min. However, no matter how the hydrogen peroxide amount is adjusted, it is manifest that both the silicon and copper removal rates would never exceed 6,000 Å/min.

In addition, the polishing composition of comparative Example 9 comprises sodium chlorite, which also belongs to a chlorous acid salt, as the single oxidizing agent, in addition to water and silicon oxide abrasive particles. The results of the polishing composition of comparative Example 9 not only show no polishing ability on copper, but show little ability on silicon.

As compared with comparative Example 9, the polishing composition of Example 2 further add 1.5 wt % of ethylenediamine merely and surprisingly, such addition allows both the silicon and copper removal rates rapidly increase. The silicon removal rate increases from 3,062 Å/min to 9,636 Å/min and the copper removal rate increases from 0 Å/min to 7,174 Å/min.

The difference between Examples 1 and 7 and comparative Example 4 is that the polishing compositions of Examples 1 and 7 further comprise sodium chlorite or potassium bromate. The result shows that both the silicon and copper removal rates attained by the polishing compositions of Examples 1 and 7 exceed 6,000 Å/min. Examples 1 and 7 are indeed superior to comparative Example 4 in this effect. In addition, comparing the results of Example 2 with comparative Example 9, it can be found that when a diamine and sodium chlorite or potassium bromate are present in the polishing composition at the same time, both silicon and copper can be removed at a higher removal rate. Thus, such polishing composition is suitable for polishing a TSV wafer.

In Examples 12 to 15 and 20, the polishing compositions are prepared by using an organic alkaline compound such as a triamine, a tetramine or like, and they also show good effects on silicon and copper. Therefore, an organic alkaline compound, such as a triamine or a tetramine that is similar to a diamine, may be used for preparing the polishing composition of the present invention.

The difference among the compositions of Examples 1 to 3 is only in the amount of the oxidizing agent. As the amount of the oxidizing agent is increased, the copper removal rate is increased while the silicon removal rate is reduced gradually. The presence of the oxidizing agent apparently facilitates the polishing of copper.

In view of all of the Examples in Table 1, all of the polishing compositions prepared by using sodium chlorite or potassium bromate as the oxidizing agent and various organic alkaline compounds such as a diamine, a triamine, a tetramine or like, allow a removal rate of higher than 6,000 Å/min, even higher than 8,000 Å/min for both silicon and copper (see the effects attained in Examples 3 to 5, 8, 10, 15, and 16). In Examples 5 and 10, both the silicon and copper removal rates exceed 9,500 Å/min.

Furthermore, in reference to the polishing compositions of Examples 12 and 14, the compositions of the two examples comprise silicon oxide abrasive particles in the same amount and an alkaline compound in the same amount, and the amount of the oxidizing agent in Example 14 is two times that in Example 12. Based on the above conclusion that "the presence of an oxidizing agent facilitates the polishing of copper" mentioned above, it can be reasonably anticipated that the copper polishing rate achieved in Example 14 will be higher than that in Example 12 before conducting the polishing treatment.

In fact, the copper polishing rate achieved in Example 12 (9,768 Å/min) is, however, higher than that in Example 14 (7,900 Å/min), and the silicon polishing rate is also good in Example 12. It could be that the additional 0.4 wt % of the amino acid in Example 12 attributes to this result. In Examples 13 and 15, their difference in ingredient is similar to that of Examples 12 and 14; however, in efficacy, Example 15 shows not only a significant improvement in copper polishing rate but also a better silicon polishing rate as compared with Example 13. Therefore, the neutralization between the amino acid and the alkaline compound does not have a great negative effect on the silicon polishing rate.

The above examples show that the method for polishing a TSV wafer according to the present invention allows simultaneously polishing conductive materials and silicon substance on a TSV wafer, and even shows an excellent polishing effect that both the conductive material and silicon polishing rates can exceed 9,500 Å/min. Such an effect is a result of using sodium chlorite and/or potassium bromate as the oxidizing agent in the method of the present invention, and in combination with the polishing composition of the present invention comprising the silicon oxide particles, organic alkaline compound and solvent. Furthermore, if the polishing composition according to present invention further comprises an amino acid, the conductive material polishing rate will be improved and sometimes the silicon polishing rate will also be simultaneously improved.

Therefore, the polishing composition and the method for polishing a TSV wafer according to the present invention provide a solution for the current CMP field of TSV wafers to rapidly polish the silicon substance and conductive material simultaneously while significantly saving working-hour costs.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for polishing a through-silicon via (TSV) wafer, comprising a step of subjecting a surface of the TSV wafer to a polishing treatment with a polishing composition comprising:
   an organic alkaline compound;
   an oxidizing agent selected from a chlorite salt and/or a bromated salt, wherein the oxidizing agent is not hydrogen peroxide;
   silicon oxide abrasive particles and a solvent, so as to simultaneously remove Si and a conductive material on the TSV wafer, wherein both the conductive material and the Si are removed at rates of about 6,000 Å/min or higher, and wherein the silicon oxide abrasive particles are present in the polishing composition from about 1.25 wt % to about 10 wt %.

2. The method for polishing a TSV wafer of claim 1, wherein the organic alkaline compound is selected from a group consisting of diamines, triamines, tetramines and combinations thereof.

3. The method for polishing a TSV wafer of claim 1, wherein the organic alkaline compound is selected from a group consisting of ethylenediamine, N-(−2-hydroxyethyl) ethylenediamine, 1,2-diaminopropane, diethylenetriamine, triethyleneteramine and combinations thereof.

4. The method for polishing a TSV wafer of claim 1, wherein the organic alkaline compound is ethylenediamine.

5. The method for polishing a TSV wafer of claim 1, wherein the solvent is water.

6. The method for polishing a TSV wafer of claim 1, wherein the polishing composition further comprises an amino acid.

7. The method for polishing a TSV wafer of claim 6, wherein the amino acid is selected from a group consisting of alanine, β-alanine, aspartic acid, arginine, glutamic acid, ethylenediaminetetraacetic acid, diethylenetriaminepentaacetic acid, propylenediaminetetraacetic acid, glycine and combination thereof.

8. The method for polishing a TSV wafer of claim 6, wherein the amino acid is glycine.

9. The method for polishing a TSV wafer of claim 1, wherein the organic alkaline compound is present in the polishing composition from about 0.01 wt % to about 10 wt %.

10. The method for polishing a TSV wafer of claim 9, wherein the organic alkaline compound is present in the polishing composition from about 0.1 wt % to about 5 wt %.

11. The method for polishing a TSV wafer of claim 1, wherein the oxidizing agent is present in the polishing composition from about 0.01 wt % to about 10 wt %.

12. The method for polishing a TSV wafer of claim 11, wherein the oxidizing agent is present in the polishing composition from about 0.1 wt % to about 5 wt %.

13. The method for polishing a TSV wafer of claim 6, wherein the amino acid is present in the polishing composition from about 0.01 wt % to about 5 wt %.

14. The method for polishing a TSV wafer of claim 1, wherein the conductive material is made of copper.

* * * * *